United States Patent [19]
Hetherington et al.

[11] 3,786,425
[45] Jan. 15, 1974

[54] INTEGRATED CIRCUIT SWITCHING NETWORK PROVIDING CROSSPOINT GAIN

[75] Inventors: Irvine Keers Hetherington, St. Charles, Ill.; Robert Leonard Pritchett, Bath, Pa.; Robert Kenneth York, Naperville, Ill.

[73] Assignee: Bell Telephone Laboratories Incorporated, Murray Hill, N.J.

[22] Filed: Dec. 18, 1972

[21] Appl. No.: 316,284

[52] U.S. Cl. ....... 340/166 R, 307/305, 317/235 AB
[51] Int. Cl. .......... H01l 11/00
[58] Field of Search ........ 340/166 R; 307/305, 307/298; 317/235 AB

[56] References Cited

UNITED STATES PATENTS 3,321,745 5/1967 Mansuetto et al. ........ 340/166
3,575,646 4/1971 Karcher ........ 307/305 X

*Primary Examiner*—Donald J. Yusko
*Attorney*—W. L. Keefauver and William H. Kamstra

[57] ABSTRACT

An integrated circuit thyristor switching network in which a parasitic pnp transistor effect, normally encountered as a result of the junction isolation employed, provides a crosspoint gain rather than the loss previously presented by the thyristor. When a thyristor crosspoint is switched to its on state, the effective pnp transistor is biased to its active region and draws current from the negatively biased substrate to augment the signals being applied to a selected network path.

12 Claims, 2 Drawing Figures

INTEGRATED CIRCUIT SWITCHING NETWORK PROVIDING CROSSPOINT GAIN

BACKGROUND OF THE INVENTION

This invention relates to electrical communications switching networks and more particularly to such networks employing semiconductor devices as crosspoint elements.

The advantages of semiconductor devices over their metallic counterparts as network crosspoint elements have generated considerable interest in this field in recent years and a number of solid state switching networks have been described in the literature. The pnpn thyristor, frequently employed in a crosspoint, for example, is superior to a metallic contact switch in a number of significant respects. It is considerably faster, requires less power, is cheaper, and, importantly, is readily adapted to miniaturization and integrated circuit fabrication techniques. At least one property of a semiconductor crosspoint, on the other hand, has heretofore limited its application to relatively small switching networks. When the semiconductor is in its "on," or conducting, state, it presents an impedance which tends to be large in comparison with the impedance of a metallic crosspoint. Such an "on" impedance characteristic is undesirable in that it introduces loss to signals transmitted through the network. This loss is the problem to which one aspect of this invention is directed and it is overcome by advantageously turning to account what hitherto has been an undesirable condition arising from the fabrication of the network as an integrated circuit.

In the fabrication of integrated circuits generally, the elements are formed in very close proximity on an electrically conductive silicon substrate. As a result, some measures must be taken to ensure electrical isolation between each element and the substrate to eliminate any coupling therebetween. One well-known method for achieving this isolation is by diode or junction isolation. In this method each element is surrounded by a reverse-biased p-n junction achieved by connecting the p-substrate of the circuit to the most negative potential of the system. A high resistance is thus presented at each junction. Since no physical additions or modifications are required in the integrated circuit structure to achieve this isolation, it has an advantage over other techniques such as air isolation, for example, in which air slots are provided in the structure to separate the elements and thus minimize coupling. One shortcoming of a junction isolated integrated circuit, however, has favored the use of alternative methods of isolation.

The effective diodes presented by the reverse-biased p-n junctions frequently create unwanted circuit components which interfere with the operation of the integrated circuit. A parasitic pnp transistor, for example, is formed by the negatively biased *p* substrate, an *n* layer, and a *p* layer of a pnpn integrated semiconductor structure. In a switching network this parasitic transistor can act to shunt signal currents applied to a network path to the circuit substrate. These parasitic effects are well known and steps have been taken in the past to eliminate or at least reduce their effect. Thus, for example, the current amplification ($\beta$) of the parasitic transistor may be intentionally reduced. The parasitic effect may be reduced by employing the aforementioned air isolation and this method is used in certain known solid state switching networks. In accordance with the principles of this invention, the normally undesirable parasitic transistor effect is advantageously employed not only to overcome the afore-mentioned transmission loss problem encountered in solid state switching networks, but in fact to realize current gain at a network crosspoint. It is thus a feature of this invention that an effective semiconductor amplifying element is realized at each crosspoint of an integrated circuit switching network without physically adding to the number of components during its fabrication.

SUMMARY OF THE INVENTION

One specific illustrative solid state switching network according to this invention is electrically organized as an xy coordinate array of crosspoint switches for selectively connecting any one of a plurality of *x* coordinate conductors with any one of a plurality of *y* coordinate conductors. Each crosspoint switch comprises a pnpn thyristor having its cathode and anode connected respectively between an *x* and a *y* coordinate conductor at their inter-section in the array, thereby providing in a conventional manner a single conducting path between each *x* coordinate conductor and any one of the *y* conductors. Conventionally, selection of a particular crosspoint is based on the characteristics of the pnpn thyristor; the thyristor is rendered conductive and switched to its "on" state by a gating pulse applied to its base and remains conductive as long as a biasing current is passed through it of a magnitude greater than a predetermined threshold level. Once the bias current falls below this level, the thyristor is returned to its "off" state. In the illustrative organization of this invention assumed for purposes of description, the bases of the thyristors lying in the *x* coordinates are multiplied together by means of individual *x* coordinate gating conductors for accomplishing the selection of one of the *x*. Selection of a *y* coordinate is accomplished by applying a biasing current to a selected *y* conductor concurrently with the selection of an *x* conductor. This organization of a switching network and the coordinate selection operation are well known in the art and such networks have been variously implemented as integrated circuits.

A monolithic integrated circuit switching network according to this invention is conventionally fabricated by known diffusion techniques. Active and passive elements are both formed in a silicon slice by diffusing impurities into prescribed areas to modify the electrical characteristics and to realize *p-n* junctions. Briefly, in one technique, a silicon substrate, lightly doped with a *p*-type dopant, first has an *n*-type buried layer diffused therein in predetermined areas where the circuit elements are to be formed. A *p*-type epitaxial layer is then grown over the entire surface after which *n*-type channels are diffused through the epitaxial layer to the *n*-type buried layer to leave isolated regions of the former layer at the circuit element sites. Within these isolated *p*-type regions areas of *n*-type material are now diffused and, finally, where pnpn semiconductors are required, regions of *p*-type material are diffused in the latter *n*-type areas. At the pnpn semiconductor sites, it is apparent that the structure comprises an *n*-type layer which surrounds on five sides a *p*-epitaxial layer, which layer in turn similarly surrounds an n-type layer, which in its turn similarly and finally surrounds a p-type layer. The latter three layers are thus isolated from the *p*-type substrate by an n-type layer, a *p-n* junction separating the latter layers.

In accordance with the junction isolation method employed in this invention, the p-n junction separating the substrate from the adjacent n-type layer of the pnpn semiconductor is reverse biased by connecting the *p*-type substrate to the most negative potential of the circuit. In the electrical interconnection of the afore-described semiconductor regions in an illustrative network crosspoint, the anode is assumed to be in electrical contact with the first *p*-type layer, the cathode is in contact with the surrounding *n*-type layer, and the base is connected to the remaining *n*-type layer. This interconnection and the reverse biasing junction isolation employed advantageously makes possible the signal amplification at a network crosspoint according to the principles of this invention. When a pnpn semiconductor at a crosspoint is rendered conductive, the p-n junction between the *p*-epitaxial layer and the cathode layer is forward biased and current flows between the anode and cathode of the pnpn element. At this time an effective additional semiconductor element is presented in the form of a pnp transistor created by the *p*-substrate, the *n*-type buried layer, and the adjacent *p*-epitaxial layer, of which transistor the substrate forms the collector, the cathode of the pnpn element forms the base, and the *p*-epitaxial layer forms the emitter. Since the substrate *p-n* junction is reverse biased, the current in the pnpn element biases the effective transistor in its active region. As a result, current is drawn from the substrate which augments the signal current being applied to the network path including the crosspoint under consideration.

A novel and improved solid state network arrangement is thus provided which features as an integral part of a crosspoint, an amplifying semiconductor realized simply as a byproduct of the isolation technique employed.

BRIEF DESCRIPTION OF THE DRAWING

The organization and operation together with the features of a solid state switching network according to this invention will be better understood from a consideration of the detailed description of one specific illustrative embodiment thereof which follows when taken in conjunction with the accompanying drawing in which.

DETAILED DESCRIPTION

Figure 1:
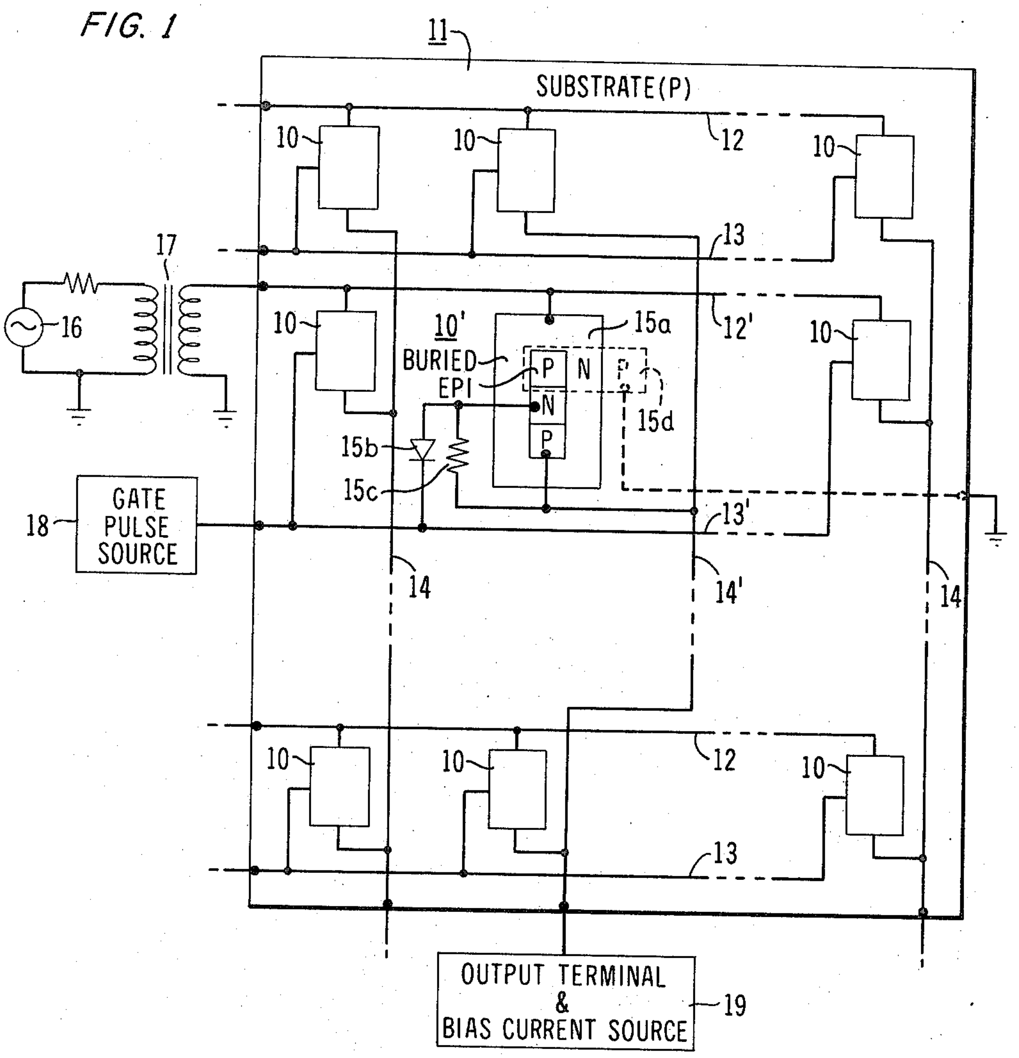
FIG. 1 depicts in general, block symbol presentation the electrical organization of an illustrative integrated circuit switching network operated in accordance with this invention.

An integrated circuit communications switching network of the character contemplated in connection with this invention is shown in FIG. 1 as comprising an xy coordinate array of crosspoint switches 10 formed integrally with a supporting substrate 11. The integrated circuit is so fabricated that the switches 10 interconnect at their intersections a plurality of *x* coordinate selection conductors 12 and gating conductors 13 and a plurality of *y* coordinate selection conductors 14. Since the switches 10 are identical, the electrical details of only a representative one are shown at switch 10' as comprising a pnpn thyristor semiconductor 15a the layers of which for convenience of identification hereinafter are labeled "p-epi", "*n*", "*p*", and "*n*(buried layer)." The semiconductor symbol employed is intended to signify that the n-type buried layer completely isolates the remaining layers from the substrate 11. The base of thyristor **15*a*** makes contact with the *n*-type layer and is connected via a diode **15*b* to gating conductor 13'. The cathode and anode of thyristor 15*a*** make contact with the *n*-type buried layer and the *p*-type layer, respectively, and are connected, respectively, to an *x* coordinate conductor 12' and *y* coordinate conductor 14'. The base and anode are connected together via a resistor **15*c***. The electrical interconnections just described are typical of thyristor network crosspoint switches generally and are provided to demonstrate an illustrative crosspoint circuit context for the practice of this invention.

The rectangular coordinate array of FIG. 1 shows only representative crosspoints and it will be appreciated that in practice the network will include any number as may reasonably be dictated by system requirements. Although not essential to an understanding of this invention, peripheral circuitry typically associated with a switching network of the character contemplated herein may be briefly considered. The *x* coordinate conductors are transformer coupled to input signal sources such as the representative source 16 coupled via a transformer 17 to conductor 12'. Gating control of the thyristors **15*a* is provided by a plurality of gate pulse sources such as the representative source 18 connected to conductor 13'**. At the output side of the network, each of the *y* coorindate conductors is provided with circuitry for applying a thyristor biasing current thereto and means are also provided at that side of the network for making available signals transmitted through the network. Representative conductor 14' is thus shown as having connected thereto an output terminal and bias current source 19. Since the details of the input, output, and control circuits are well known in the art, they are shown in block symbol form only and need not be further described other than to specify hereinafter the character of the outputs generated.

Figure 2:
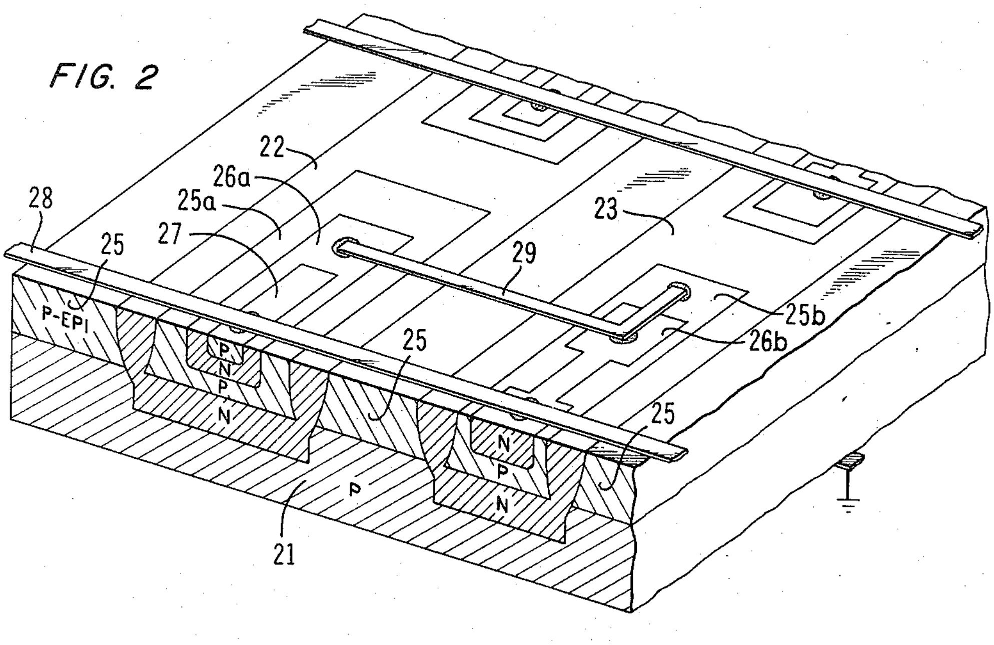
FIG. 2 depicts in a perspective, cross-section view the details of the integrated circuit structure of a typical one of the crosspoints of the network of FIG. 1.

The physical implementation as an integrated circuit of the network elements shown schematically in FIG. 1 is demonstrated by a fragmentary portion of one illustrative structure shown in partial section view in FIG. 2. The integrated circuit portion there shown comprises a *p*-type silicon substrate 21 on which the pnpn thyristors, diodes, and resistors of the crosspoints are formed by well-known diffusion techniques as isolated layers of semiconductor material. A single crosspoint is shown in the figure as comprising a pair of *n*-type longitudinal layers 22 and 23 each initially being diffused in the substrate 21, overlaid with a grown *p*-type epitaxial layer 25 labeled *p* in the drawing, and then diffused again to penetrate the latter layer to leave the original *n*-type diffusions as buried layers and isolated layers of *p*-type material **25*a* and 25*b*** within the *n*-type layers **22*n* and 23*n***, respectively. Second *n*-type layers **26*a* and 26*b*** are diffused within the *p*-epitaxial layers **25*a* and 25*b*, respectively, and a final p-type layer 27** is diffused within the *n*-type layer **26*a*. The semiconductor layers thus identified may be related to the elements of the schematic version of FIG. 1 as follows: layer 22** forms the *n*-type layer of thyristor **15*a*** as its cathode which is common to other crosspoints of its $x$ coordinate represented schematically as conductor 12 in FIG. 1, layer 23 forms with the $p$-epitaxial layer 25$b$ the diode 15$b$ and also forms an $x$ coordinate gating conductor 13, layer 26$a$ provides the n-type base contact of thyristor 15$a$ and layer 26$b$ makes up resistor 15$c$. The circuit connections are completed for one illustrative crosspoint in FIG. 2 by metallic conductors 28 and 29. Conductor 28 comprises a $y$ coordinate conductor 14 and as such makes an electrical connection with anode $p$-type layer 27 of thyristor 15$a$ and with one end of resistor layer 26$b$. Metallic conductor 29 makes electrical contact with base layer 26$a$ and the other end of resistor layer 26$b$ to complete the crosspoint interconnections.

With the foregoing organization of an illustrative solid state network according to this invention in mind, a description of a typical operation thereof will best bring out its novel features. For this purpose it will be assumed that the crosspoint 10′ of the network of FIG. 1 has been selected to establish a transmission path therethrough. Normally the diodes 15$b$ of the crosspoints associated with the selected $x$ coordinate gating conductor 13′ are back biased by a positive voltage supplied by gate pulse source 18 to ensure that no base current is drawn from thyristors 15$a$. When gate conductor 13′ is selected as one of the coordinates defining crosspoint 10′, a negative-going pulse is applied to conductor 13′ from source 18, thereby forward biasing diode 15$b$ of the selected coordinates and applying a gating voltage pulse to the bases of thyristors 15$a$, the amplitude of which pulse is greater than a predetermined threshold level to render the thyristors conductive. When conductive, the thyristor presents between its anode and cathode a low impedance and remains conductive at the termination of the gating pulse as long as the anode-to-cathode current remains higher than a characteristic biasing level. This biasing current is selectively applied from the source 19 to the selected $y$ coordinate conductor 14′ defining in the other coordinate the crosspoint 10′. Thyristor 15$a$ of crosspoint 10′ is now conductive and remains in that state after the termination of the gating pulse from source 18 until the termination of the biasing current from source 19.

When the pnpn thyristor 15$a$ of crosspoint 10′ turns conductive, the p-n(cathode) junction is forward biased. In accordance with the junction isolation employed in this invention, however, the substrate is connected to the most negative point of the system, in the present case, to ground. The $n$(cathode)-p(substrate) junction is thus always reverse biased. As a result and as represented in FIG. 1, an effective pnp transistor 15$d$ is presented, the $p$(substrate) collector of which is electrically at ground potential, the emitter of which is the thyristor p-epi layer, and the base of which is the buried layer $n$ region (cathode) of thyristor 15$a$. With the forward biasing of the thyristor $p$-$n$(cathode) junction, effective transistor 15$d$ is now biased in its active region. As a result, current is drawn from the substrate 11 to augment the signal current being supplied by source 16. The gain thus introduced by effective transistor 15$d$ may be seen from the instantaneous current relationships in the transistor, that is, between the instantaneous current through the emitter of transistor 15$d$, $i_{out}$, instantaneous current from source 16, $i_{in}$, and instantaneous substrate current, $i_{sub}$. On the positive cycle, the instantaneous current, $i_{out+}$, through the emitter of transistor 15$d$ is given as:

$$i_{out+} = i_{in+} + i_{sub+} \tag{1}$$

and on the negative cycle, the instantaneous current, $i_{out-}$, through the emitter of transistor 15$d$ is given as:

$$i_{out-} + i_{in-} + i_{sub-}. \tag{2}$$

In general $$i_{out} = i_{in} + i_{sub} \tag{3}$$

where $$i_{sub} = \beta_{si}\, i_{in} \tag{4}$$

$\beta_{si}$ being the beta of transistor 15$d$. The gain of crosspoint 10′ is thus evident from $$i_{out} = (\beta_{si} + 1) i_{in}. \tag{5}$$

Any series resistance encountered in a solid state crosspoint element is readily compensated for by realizable betas in the order of 0.1.

What has been described is considered to be only one specific illustrative embodiment of this invention and it is to be understood that various and numerous other arrangements may be devised by one skilled in the art without departing from the spirit and scope thereof as defined by the appended claims.

What is claimed is:

1. An integrated circuit switching network comprising a coordinate array of crosspoint switches interconnecting $x$ and $y$ coordinate conductors, said switches including semiconductor devices having a conducting and a nonconducting state and being formed on a single substrate, each of said devices having four layers alternating in conductivity type with each other and with the conductivity type of said substrate, each of said $x$ coordinate conductors comprising a continuous layer of said devices adjacent said substrate, means for reverse biasing the junction of said last-mentioned layer and said substrate for electrically isolating said $x$ coordinate conductors from each other, and amplifying means at each of said crosspoint switches comprising transistor means made up of said last-mentioned layer and its adjacent layers including said substrate, said transistor means being biased in its active region when said semiconductor device is in its conducting state.

2. An integrated circuit switching network comprising an array of crosspoint switches interconnecting a first and a second plurality of intersecting conductors for selectively establishing electrical connections therebetween, said switches each including semiconductor devices each having a conducting and a nonconducting state and being formed on a single semiconductor substrate, each of said devices having a plurality of semiconductor layers alternating in conductivity type with each other and with the conductivity type of said substrate, means for electrically isolating each of said devices from each other comprising biasing means for reverse biasing the junction of said substrate and the adjacent semiconductor layer of each of said devices, and amplifying means at each of said crosspoint switches comprising transistor means formed by said substrate and the two successive adjacent semiconductor layers of a semiconductor device, said transistor means being biased in its active region when said semiconductor device is in its conducting state.

3. An integrated circuit switching network as claimed in claim 2 in which each of said semiconductor devices comprises a pnpn transistor and said substrate is of the *p* conductivity type.

4. An integrated circuit switching network as claimed in claim 3 in which the conductors of one plurality of said first and second plurality of conductors each comprises a continuous semiconductor layer common to a plurality of said semiconductor devices adjacent said substrate.

5. An integrated circuit switching network as claimed in claim 3 in which said biasing means comprises means for applying the most negative potential of said switching network to said substrate.

6. An electrical crosspoint switch for a switching network comprising a semiconductor device having a plurality of layers of alternating conductivity types and having a nonconducting state and a conducting state for establishing a transmission path through said network, said device being formed on a semiconductor substrate of a conductivity type opposite to the conductivity type of the adjacent layer of said semiconductor device, means for electrically isolating said semiconductor device comprising biasing means for reverse biasing the junction of said substrate and said adjacent layer of said semiconductor device, and amplifying means comprising transistor means having alternating conductivity type layers including said adjacent layer and said substrate, said transistor means being biased in its active region when said semiconductor device is in its conducting state.

7. An electrical crosspoint switch as claimed in claim 6 in which said semiconductor device is a pnpn transistor and said substrate is a *p* conductivity type semiconductor.

8. An electrical crosspoint switch as claimed in claim 7 in which said alternating conductivity type layers of said transistor means comprise a *p* and an *n* type layer of said pnpn transistor and said p conductivity type substrate semiconductor.

9. An electrical crosspoint switch as claimed in claim

8 in which said biasing means comprises means for maintaining said substrate at a lower potential than the potential of the other elements of said crosspoint switch.

10. An integrated circuit switching network comprising a first plurality of conductors, a second plurality of conductors intersecting said first plurality of conductors to define an array of crosspoints, and a crosspoint switch means at one of said crosspoints for establishing a transmission path through said network including a first selected conductor of said first plurality of conductors and a second selected conductor of said second plurality of conductors, said crosspoint switch means comprising a semiconductor device having a nonconducting state and a conducting state and being formed on a semiconductor substrate, said device comprising a plurality of semiconductor layers alternating in conductivity type with each other and with the conductivity type of said substrate, an anode connected to said first selected conductor, a cathode connected to said second selected conductor, and a base; means for electrically isolating said semiconductor device comprising biasing means for reverse biasing the junction of said substrate and the adjacent layer of said semiconductor device; means for applying a control pulse to said base of said semiconductor device for switching said last-mentioned device to said conducting state, the junction of the two successive layers adjacent said substrate being forward biased by a signal current applied to said cathode, and amplifying means comprising a transistor means comprising said successive layers having said forward biased junction and said substrate, said transistor means being biased in its active region by said signal current to conduct current from said substrate to said cathode of said semiconductor device.

11. An integrated circuit switching network as claimed in claim 10 in which said semiconductor device comprises a transistor having a *p*-type anode layer, an *n*-type base layer, a *p*-type layer, and an *n*-type cathode layer.

12. An integrated circuit switching network as claimed in claim 11 in which said transistor means is made up of said p-type anode layer, said n-type cathode layer, and said p-type substrate.

* * * * *